United States Patent
Dudek

(10) Patent No.: US 10,263,124 B2
(45) Date of Patent: Apr. 16, 2019

(54) III-V SEMICONDUCTOR DIODE

(71) Applicant: 3-5 Power Electronics GmbH, Dresden (DE)

(72) Inventor: Volker Dudek, Ettlingen (DE)

(73) Assignee: 3-5 Power Electronics GmbH, Dresden (DE)

( * ) Notice: Subject to any disclaimer, the term of this patent is extended or adjusted under 35 U.S.C. 154(b) by 0 days.

(21) Appl. No.: 15/812,432

(22) Filed: Nov. 14, 2017

(65) Prior Publication Data

US 2018/0138320 A1    May 17, 2018

(30) Foreign Application Priority Data

Nov. 14, 2016  (DE) .................. 10 2016 013 540

(51) Int. Cl.
*H01L 21/30*    (2006.01)
*H01L 29/872*   (2006.01)
(Continued)

(52) U.S. Cl.
CPC .......... *H01L 29/872* (2013.01); *H01L 21/185* (2013.01); *H01L 29/0657* (2013.01);
(Continued)

(58) Field of Classification Search
CPC .................................................... H01L 21/30
See application file for complete search history.

(56) References Cited

U.S. PATENT DOCUMENTS 3,958,265 A * 5/1976 Charmakadze ..... H01L 33/0025
                                                      257/96
5,038,187 A * 8/1991 Zhou .................. H01L 29/7785
                                                      257/14
(Continued)

FOREIGN PATENT DOCUMENTS

CN    203118957 U    8/2013
CN    103700712 A    4/2014
(Continued)

OTHER PUBLICATIONS

Bhojani et al., "Gallium arsenide semiconductor parameters extracted from pin diode measurements and simulations," IET Power Electronics, vol. 9, No. 4, pp. 689-697 (Mar. 30, 2016).
(Continued)

*Primary Examiner* — Kyoung Lee
*Assistant Examiner* — Christina A Sylvia
(74) *Attorney, Agent, or Firm* — Muncy, Geissler, Olds & Lowe, P.C.

(57) ABSTRACT

A stacked III-V semiconductor diode having an $n^+$ substrate with a dopant concentration of at least $10^{19}$ $cm^{-3}$ and a layer thickness of 50-400 μm, an $n^-$ layer with a dopant concentration of $10^{12}$-$10^{16}$ $cm^{-3}$ and a layer thickness of 10-300 μm, a $p^+$ layer with a dopant concentration of $5 \cdot 10^{18}$-$5 \cdot 10^{20}$ $cm^{-3}$, including a GaAs compound and with a layer thickness greater than 2 μm, wherein the $n^+$ substrate and the $n^-$ layer are integrally joined to one another. A doped intermediate layer with a layer thickness of 1-50 μm and a dopant concentration of $10^{12}$-$10^{17}$ $cm^{-3}$ is arranged between the $n^-$ layer and the $p^+$ layer, and the intermediate layer is integrally joined to the $n^-$ layer and to the $p^+$ layer.

14 Claims, 1 Drawing Sheet

(51) Int. Cl.
*H01L 29/207* (2006.01)
*H01L 21/18* (2006.01)
*H01L 29/06* (2006.01)
*H01L 29/36* (2006.01)
*H01L 29/66* (2006.01)
*H01L 29/861* (2006.01)

(52) U.S. Cl.
CPC ........ *H01L 29/0692* (2013.01); *H01L 29/207* (2013.01); *H01L 29/36* (2013.01); *H01L 29/66204* (2013.01); *H01L 29/861* (2013.01)

(56) References Cited

U.S. PATENT DOCUMENTS 5,733,815 A 3/1998 Ashkinazi et al.
9,647,083 B2 5/2017 Schloegl et al.

FOREIGN PATENT DOCUMENTS

| DE | 40 36 222 A1 | 5/1992 |
| DE | 10 2015 208 097 A1 | 11/2016 |
| JP | S4634657 Y1 | 11/1971 |
| JP | 2001015769 A | 1/2011 |

OTHER PUBLICATIONS

Ashkinazi, "GaAs Power Devices," ISBN 965-7094-19-4, pp. 8-9 (1999).

\* cited by examiner

III-V SEMICONDUCTOR DIODE

This nonprovisional application claims priority under 35 U.S.C. § 119(a) to German Patent Application No. 10 2016 013 540.9, which was filed in Germany on Nov. 14, 2016, and which is herein incorporated by reference.

BACKGROUND OF THE INVENTION

Field of the Invention

The invention relates to a III-V semiconductor diode.

Description of the Background Art

A high-voltage semiconductor diode $p^+$-n-$n^+$ is known from "GaAs Power Devices," by German Ashkinazi, ISBN 965-7094-19-4, pages 8 and 9.

SUMMARY OF THE INVENTION

It is therefore an object of the invention to provide a device that advances the state of the art.

According to an exemplary embodiment of the invention, a III-V semiconductor diode is provided, having an $n^+$ substrate with a dopant concentration of at least $10^{19}$ cm$^{-3}$ and a layer thickness of 50-400 μm, wherein the $n^+$ substrate includes a GaAs compound or is made of a GaAs compound.

In addition, the III-V semiconductor diode has an $n^-$ layer with a dopant concentration of $10^{12}$-$10^{16}$ cm$^{-3}$ and a layer thickness of 10-300 μm, as well as a $p^+$ layer with a dopant concentration of $5 \cdot 10^{18}$-$5 \cdot 10^{20}$ cm$^{-3}$ and with a layer thickness greater than 1 μm, wherein the $n^-$ layer and the $p^+$ layer include a GaAs compound or are made of a GaAs compound, and the $n^+$ substrate and the $n^-$ layer are integrally joined to one another.

Arranged between the $n^-$ layer and the $p^+$ layer is a doped intermediate layer with a layer thickness of 1-50 μm and a dopant concentration of $10^{12}$-$10^{17}$ cm$^{-3}$, wherein the intermediate layer is integrally joined to the $n^-$ layer and to the $p^+$ layer.

It is a matter of course that the intermediate layer can have at least a different dopant concentration in comparison with the integrally joined layers.

An advantage is that reverse voltages in a range of 200 V-3300 V with smaller turn-on resistances and lower capacitances per area than conventional high-blocking diodes made of Si or SiC can be produced in a simple manner with the III-V semiconductor diode according to the invention. In this way, it is possible to achieve switching frequencies from 30 kHz to as much as 0.5 GHz and current densities from 0.5 A/mm$^2$ to 5 A/mm$^2$.

Another advantage is that the III-V semiconductor diodes can be manufactured more economically than comparable high-blocking diodes made of SiC.

In particular, the III-V semiconductor diodes according to the invention can be used as freewheel diodes.

It should be noted that the III-V semiconductor diodes according to the invention in the present case have small turn-on resistances in a range between 1 mohm and 200 mohm. The capacitances per area are in a range between 2 pF and 100 pF.

An additional advantage of the III-V semiconductor diodes according to the invention is a high thermal stability of up to 300° C. In other words, the III-V semiconductor diodes can also be used in hot environments.

In a first embodiment, the intermediate layer is p-doped in design and, according to alternative improvements, includes zinc and/or silicon as dopants. The dopant concentration in the intermediate layer is lower than the dopant concentration in the $p^+$ layer. Preferably, the dopant concentration is lower in a range between a factor of 2 to a factor of 100,000, which is to say five orders of magnitude lower.

In an embodiment, the intermediate layer is n-doped in design and preferably includes silicon as dopant. The dopant concentration in the intermediate layer is lower than the dopant concentration in the $n^+$ substrate. Preferably, the dopant concentration is up to a factor of 100 lower than in the n layer.

In an embodiment, the $p^+$ layer includes zinc as dopant. The $n^-$ layer and/or the $n^+$ substrate preferably includes silicon and/or chromium and/or palladium as dopants.

In an embodiment, the stacked layer structure includes the $n^+$ substrate, the $n^-$ layer, the intermediate layer, and the $p^+$ layer is monolithic in design.

In an embodiment, a total height of the stacked layer structure is formed of the $n^+$ substrate, the $n^-$ layer, the intermediate layer, and the $p^+$ layer is a maximum of 150-500 μm.

A surface of the layer structure can be designed to be quadrilateral, in particular rectangular or square, and with an edge length in a range between 1 mm and 20 mm. In an improvement, the quadrilateral structures each have rounded edges and/or corners in order to prevent field strength peaks, in particular at voltages above 500 V.

In an embodiment, the stacked layer structure, formed of the $p^-$ layer, the $n^-$ layer, and the $n^+$ layer, has a semiconductor bond formed between the $n^-$ layer and the $p^-$ layer. It should be noted that the term 'semiconductor bond' can be used synonymously with the term 'wafer bond'. The layer structure has a first partial stack, comprising the $p^-$ layer, and a second partial stack, comprising the $n^+$ layer and the $p^-$ layer. The first partial stack and the second partial stack are each formed monolithically.

The $p^-$ layer can have a doping of less than $10^{13}$ N/cm$^{-3}$ or a doping between $10^{13}$ N/cm$^{-3}$ and $10^{15}$ N/cm$^{-3}$. In an embodiment, the $p^-$ layer is thinned before or after the bonding by a grinding process to a thickness between 10 μm and 300 μm.

In an embodiment, a first partial stack is provided, wherein the first partial stack comprises the $p^-$ layer, and further a second stack is provided, wherein the second partial stack comprises the $n^-$ layer and the $n^+$ layer, and the first partial stack is connected to the second stack by a wafer bonding process.

In an embodiment, the second stack is formed in which the $n^-$ layer can be formed proceeding from an $n^-$ substrate; in this case the $n^-$ substrate or the $n^-$ layer will be or is connected to the second stack by a wafer bonding process. In a further process step, the $n^-$ substrate or the $n^-$ layer is thinned to the desired thickness. For example, the thickness of the $n^-$ layer is within a range between 50 μm and 250 μm. The doping of the $n^-$ layer can be in a range between $10^{13}$ N/cm$^{-3}$ and $10^{15}$ N/cm$^{-3}$. An advantage of the wafer bonding is that thick $n^-$ layers can be easily produced. A longer deposition process during epitaxy is not necessary as a result. The number of stacking errors can also be reduced by means of the bonding.

In an embodiment, the $n^-$ layer has a doping greater than $10^{10}$ N/cm$^{-3}$ and less than $10^{13}$ N/cm$^{-3}$. Because the doping is extremely low, the $n^-$ layer can also be understood as an intrinsic layer.

In an embodiment, after the thinning of the n⁻ substrate or the n⁻ layer by epitaxy or high-dose implantation, the n⁺ layer is produced on the n⁻ substrate or the p⁻ layer in a range between $10^{18}$ N/cm⁻³ and less than $5 \times 10^{19}$ N/cm⁻³. The thinning of the n⁻ substrate or the n⁻ layer occurs for example by means of a CMP step, i.e., by means of chemical mechanical polishing.

In an embodiment, an auxiliary layer is deposited on the front side of the diode structure. The rear side of the diode structure can then be thinned and placed on a carrier. In an embodiment, the front side is then removed.

In an embodiment, the surface of the n⁺ layer and the surface of the p⁻ layer are metallized in order to form and electrically connect the Schottky diode. Preferably, the cathode of the semiconductor diode is materially connected to a base formed as a heat sink after the metallization. In other words, the anode is formed on the surface of the diode on the p⁻ layer.

Tests have shown that different blocking voltages can be achieved with specific combinations of a p⁻ intermediate layer and n⁻ layer.

In a first embodiment, the p⁻ intermediate layer comprises: a thickness between 10 μm and 25 μm and a thickness between 40 μm and 90 μm for the n⁻ layer results in a blocking voltage of about 900 V.

In a second embodiment, the p⁻ intermediate layer comprises: a thickness between 25 μm and 35 μm and a thickness between 40 μm and 70 μm for the n⁻ layer results in a blocking voltage of about 1200 V.

In a third embodiment, the p⁻ intermediate layer comprises: a thickness between 35 μm and 50 μm and a thickness between 70 μm and 150 μm for the n⁻ layer results in a blocking voltage of about 1500 V.

The diodes described above in the first to third embodiments can be also be designated as punch-through diodes in regard to the formation of the space charge regions.

In a fourth embodiment, the p⁻ intermediate layer comprises: a thickness between 10 μm and 25 μm and a thickness between 60 μm and 110 μm for the n⁻ layer.

In a fifth embodiment, the p⁻ intermediate layer comprises: a thickness between 10 μm and 25 μm and a thickness between 70 μm and 140 μm for the n⁻ layer.

In a sixth embodiment, the p⁻ intermediate layer comprises: a thickness between 35 μm and 50 μm and a thickness between 80 μm and 200 μm for the n⁻ layer.

The diodes described above in the fourth to sixth embodiments can also be designated as "non-reach-through" diodes in regard to the formation of space charge regions.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
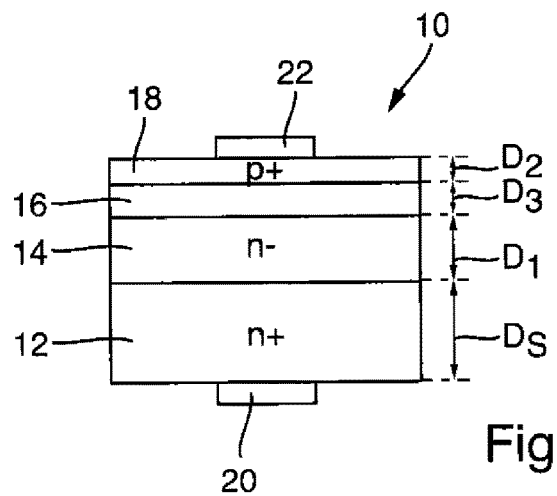
FIG. 1 shows a view of an embodiment according to the invention of a III-V semiconductor diode.

The illustration in FIG. 1 shows a view of a first embodiment of a stacked III-V semiconductor diode 10 according to the invention, having an n⁺ substrate 12, a lightly doped n⁻ layer 14 integrally joined to the substrate 12, an intermediate layer 16 integrally joined to the n⁻ layer 14, a p⁺ layer 18 integrally joined to the intermediate layer 16, as well as a first contact 20 and a second contact 22. The first contact 20 is integrally joined to a bottom of the n⁺ substrate 12, while the second contact 22 is integrally joined to a top of the p⁺ layer 18.

The n⁺ substrate 12 is heavily n-doped and has a dopant concentration of $10^{19}$ cm⁻³. A layer thickness DS of the substrate 12 is between 100 μm and 400 μm.

The n⁻ layer 14 is lightly doped with a dopant concentration of $10^{12}$-$10^{16}$ cm⁻³, and has a layer thickness D1 of 10-300 μm.

The intermediate layer 16 has a layer thickness D3 of 1-50 μm, and light doping with a dopant concentration of $10^{12}$-$10^{17}$ cm⁻³.

The p⁺ layer 18 is heavily p-doped with a dopant concentration of $10^{19}$ cm⁻³ and a layer thickness D2 greater than 2 μm.

Figure 2:
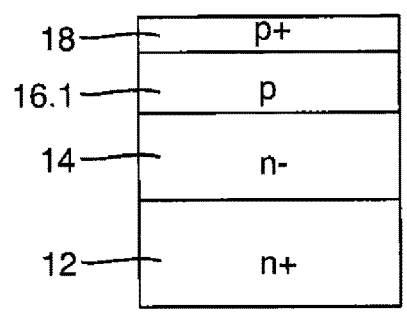
FIG. 2 shows a view of an embodiment according to the invention of a layer sequence.
Figure 3:
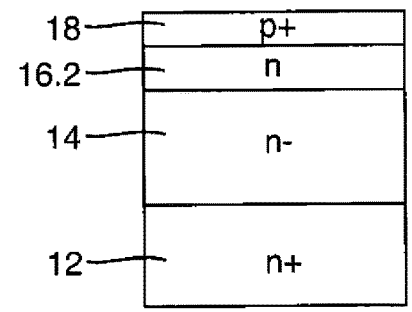
FIG. 3 shows a view of an embodiment according to the invention of a layer sequence.

The illustrations in FIGS. 2 and 3 show two alternative embodiments of a layer structure 100 of a III-V semiconductor diode according to the invention, formed of the n⁺ substrate 12, the n⁻ layer 14, the intermediate layer 16, and the p⁺ layer 18. Only the differences from the illustration in FIG. 1 are explained below.

According to a first embodiment, the layer structure 100 can have a lightly p-doped intermediate layer 16.1, as shown in FIG. 2. Alternatively, the layer sequence has a lightly n-doped intermediate layer 16.2, as shown in FIG. 3.

Figure 4:
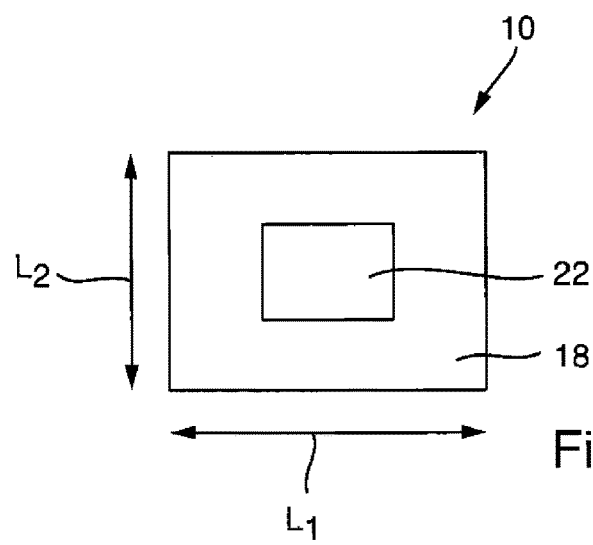
FIG. 4 shows a view of the III-V semiconductor diode from FIG. 1.

The illustration in FIG. 4 shows a view of the first embodiment of a III-V semiconductor diode according to the invention represented in FIG. 1. Only the differences from the illustration in FIG. 1 are explained below.

The stacked layer structure 100 of the III-V semiconductor diode 10 formed of the n⁺ substrate 12, the n⁻ layer 14, the intermediate layer 16, and the p⁺ layer 18 has a rectangular perimeter, and thus also a rectangular surface, with the edge lengths L1 and L2. The contact area 22 located on the surface of the layer sequence 100 covers only a part of the surface.

It is a matter of course that the stack also has a quadrilateral surface in an embodiment that is not shown. In particular, the surface is square in design.

In an embodiment, the corners can be rounded in the angular implementations in order to prevent field strength peaks at high voltages.

In an embodiment, the surface can be round in design. In this way, spikes in the field strength are reduced especially effectively. Preferably, the surface is circular or oval in design.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked III-V semiconductor diode comprising:
an n⁺ substrate with a dopant concentration of at least $10^{19}$ cm$^{-3}$ and a layer thickness of 50-400 μm, the n⁺ substrate formed of a GaAs compound;
an n⁻ layer with a dopant concentration of $10^{12}$-$10^{18}$ cm$^{-3}$, a layer thickness of 10-300 μm, the n⁻ layer formed of a GaAs compound, the n⁺ substrate and the n⁻ layer being integrally joined to one another;
a p⁺ layer with a dopant concentration of $5 \cdot 10^{18}$-$5 \cdot 10^{20}$ cm$^{-3}$, with a layer thickness greater than 2 μm, the p⁺ layer formed of a GaAs compound; and
a doped intermediate layer with a layer thickness of 1-50 μm and a dopant concentration of $10^{12}$-$10^{17}$ cm$^{-3}$ arranged between the n⁻ layer and the p⁺ layer,
wherein the doped intermediate layer is integrally joined to the n⁻ layer and to the p⁺ layer.

2. The III-V semiconductor diode according to claim 1, wherein the doped intermediate layer is p-doped.

3. The III-V semiconductor diode according to claim 2, wherein a dopant concentration in the doped intermediate layer is lower than a dopant concentration in the p⁺ layer, and is lower in a range between a factor of 2 to a factor of five orders of magnitude.

4. The III-V semiconductor diode according to claim 1, wherein the doped intermediate layer includes zinc or silicon.

5. The III-V semiconductor diode according to claim 1, wherein the doped intermediate layer is n-doped in design.

6. The III-V semiconductor diode according to claim 1, wherein the doped intermediate layer includes silicon and/or tin.

7. The III-V semiconductor diode according to claim 5, wherein the dopant concentration in the intermediate layer is lower than the dopant concentration in the n⁻ layer by up to a factor of 100.

8. The III-V semiconductor diode according to claim 1, wherein the n⁺ substrate includes zinc.

9. The III-V semiconductor diode according to claim 1, wherein the n⁻ layer and/or the n⁺ substrate include silicon and/or chromium and/or palladium and/or zinc.

10. The III-V semiconductor diode according to claim 1, wherein a stacked layer structure formed of the p⁺ layer, the n⁻ layer, the doped intermediate layer, and the n⁺ substrate are monolithic in design.

11. The III-V semiconductor diode according to claim 1, wherein a total height of a stacked layer structure formed of the p⁺ layer, the n⁻ layer, the doped intermediate layer, and the n⁺ substrate is a maximum of 150-500 μm.

12. The III-V semiconductor diode according to claim 1, wherein a stacked layer structure formed of the p⁺ layer, the n⁻ layer, the doped intermediate layer, and the n⁺ substrate has a rectangular or square surface with edge lengths between 1 mm and 10 mm.

13. The III-V semiconductor diode according to claim 1, wherein a stacked layer structure formed of the p⁺ layer, the n⁻ layer, the doped intermediate layer, and the n⁺ substrate has a round, oval, or circular surface.

14. The III-V semiconductor diode according to claim 1, wherein a first partial stack is provided, wherein the doped intermediate layer is grown from the p⁺ layer via epitaxy, wherein a second stack is provided, wherein a second partial stack comprises the n⁻ layer, and wherein the n⁻ layer is connected to the second stack by a wafer bonding process.

* * * * *